United States Patent
David et al.

(10) Patent No.: US 10,459,961 B2
(45) Date of Patent: Oct. 29, 2019

(54) VECTOR PROCESSING FOR SEGMENTATION HASH VALUES CALCULATION

(71) Applicant: HUAWEI TECHNOLOGIES CO., LTD., Shenzhen, Guangdong (CN)

(72) Inventors: Yehonatan David, Hod Hasharon (IL); Yair Toaff, Hod Hasharon (IL); Michael Hirsch, Hod Hasharon (IL)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/667,267

(22) Filed: Aug. 2, 2017

(65) Prior Publication Data
US 2017/0344559 A1  Nov. 30, 2017

Related U.S. Application Data

(63) Continuation of application No. PCT/EP2016/058673, filed on Apr. 19, 2016.

(51) Int. Cl.
*G06F 16/33* (2019.01)
*G06F 16/23* (2019.01)
(Continued)

(52) U.S. Cl.
CPC ...... *G06F 16/3347* (2019.01); *G06F 9/30036* (2013.01); *G06F 9/3867* (2013.01);
(Continued)

(58) Field of Classification Search
CPC combination set(s) only.
See application file for complete search history.

(56) References Cited

U.S. PATENT DOCUMENTS

| 5,990,810 A | 11/1999 | Williams |
| 6,704,730 B2 | 3/2004 | Moulton et al. |

(Continued)

FOREIGN PATENT DOCUMENTS

| CN | 103281538 A | 9/2013 |
| CN | 104050234 A | 9/2014 |

(Continued)

OTHER PUBLICATIONS

"Data Domain Files IPO, Cuts Deal with Quantum," Ziff Davis Media, Mar. 31, 2007, total 3 pages.
(Continued)

*Primary Examiner* — Shyue Jiunn Hwa
(74) *Attorney, Agent, or Firm* — Leydig, Voit & Mayer, Ltd.

(57) ABSTRACT

A system for segmenting an input data stream using vector processing, comprising a processor adapted to repeat the following steps throughout an input data stream to create a segmented data stream consisting a plurality of segments: apply a rolling sequence over a sequence of consecutive data items of an input data stream, the rolling sequence includes a subset of consecutive data items of the sequence, calculate concurrently a plurality of partial hash values each by one of a plurality of processing pipelines of the processor, each for a respective one of a plurality of partial rolling sequences each including evenly spaced data items of the subset, determine compliance of each of the plurality of partial hash values with one or more respective partial segmentation criteria and designate the sequence as a variable size segment when at least some of the partial hash values comply with the respective partial segmentation criteria.

12 Claims, 10 Drawing Sheets

(51) Int. Cl.
*G06F 16/2455* (2019.01)
*H03M 7/30* (2006.01)
*G06F 9/30* (2018.01)
*G06F 9/38* (2018.01)

(52) U.S. Cl.
CPC .... *G06F 16/2365* (2019.01); *G06F 16/24568* (2019.01); *H03M 7/3095* (2013.01)

(56) References Cited

U.S. PATENT DOCUMENTS

| | | | |
|---|---|---|---|
| 7,143,091 B2 | 11/2006 | Charnock et al. | |
| 8,024,317 B2 | 9/2011 | Nair et al. | |
| 8,032,508 B2 | 10/2011 | Martinez et al. | |
| 8,060,492 B2 | 11/2011 | Nair et al. | |
| 8,299,944 B2 | 10/2012 | Provenzano | |
| D676,167 S | 2/2013 | Lai | |
| 8,396,905 B2 | 3/2013 | Provenzano | |
| 8,402,004 B2 | 3/2013 | Provenzano et al. | |
| 8,407,428 B2 | 3/2013 | Cheriton et al. | |
| D680,519 S | 4/2013 | Ito | |
| 8,417,674 B2 | 4/2013 | Provenzano | |
| 8,504,791 B2 | 8/2013 | Cheriton et al. | |
| 8,601,222 B2 | 12/2013 | Flynn et al. | |
| 8,688,650 B2 | 4/2014 | Mutalik et al. | |
| 8,788,769 B2 | 7/2014 | Abercrombie et al. | |
| 8,843,489 B2 | 9/2014 | Provenzano | |
| 8,849,759 B2 | 9/2014 | Bestler et al. | |
| 8,874,863 B2 | 10/2014 | Mutalik et al. | |
| 8,904,126 B2 | 12/2014 | Ashutosh et al. | |
| 8,935,506 B1 | 1/2015 | Gopalan | |
| 8,965,854 B2 | 2/2015 | Provenzano et al. | |
| 8,966,191 B2 | 2/2015 | Flynn et al. | |
| 8,983,915 B2 | 3/2015 | Mutalik et al. | |
| 9,015,425 B2 | 4/2015 | Flynn et al. | |
| 9,075,710 B2 | 7/2015 | Talagala et al. | |
| 9,076,599 B2 | 7/2015 | Endo et al. | |
| D737,528 S | 8/2015 | Dammkoehler | |
| 9,157,876 B2 | 10/2015 | Halderman et al. | |
| 9,244,967 B2 | 1/2016 | Provenzano et al. | |
| 9,250,817 B2 | 2/2016 | Flynn et al. | |
| 9,251,062 B2 | 2/2016 | Flynn et al. | |
| 9,251,198 B2 | 2/2016 | Mutalik et al. | |
| 9,256,368 B2 | 2/2016 | Welnicki et al. | |
| D756,678 S | 3/2016 | Rawls-Meehan | |
| 9,323,465 B2 | 4/2016 | Flynn et al. | |
| 9,372,758 B2 | 6/2016 | Ashutosh et al. | |
| 9,372,866 B2 | 6/2016 | Provenzano | |
| 9,384,207 B2 | 7/2016 | Provenzano et al. | |
| 9,384,254 B2 | 7/2016 | Tekade et al. | |
| 9,400,987 B2 | 7/2016 | Nair et al. | |
| 9,424,184 B2 | 8/2016 | Flynn et al. | |
| 9,495,435 B2 | 11/2016 | Zhang et al. | |
| 9,501,545 B2 | 11/2016 | Woodward et al. | |
| 9,501,546 B2 | 11/2016 | Bhargava et al. | |
| 9,548,908 B2 | 1/2017 | Nguyen et al. | |
| 9,563,555 B2 | 2/2017 | Flynn et al. | |
| 9,563,683 B2 | 2/2017 | Abercrombie et al. | |
| 9,646,067 B2 | 5/2017 | Abercrombie et al. | |
| 9,659,077 B2 | 5/2017 | Chen et al. | |
| 9,665,304 B2 | 5/2017 | Iwanicki et al. | |
| 9,665,437 B2 | 5/2017 | Bhargava et al. | |
| 9,754,005 B2 | 9/2017 | Potter et al. | |
| 9,772,916 B2 | 9/2017 | Rangasamy et al. | |
| 2006/0253418 A1 | 11/2006 | Charnock et al. | |
| 2010/0125569 A1 | 5/2010 | Nair et al. | |
| 2010/0125605 A1 | 5/2010 | Nair et al. | |
| 2011/0153700 A1* | 6/2011 | Gopal | G06F 9/30029 708/209 |
| 2012/0123999 A1 | 5/2012 | Ashutosh et al. | |
| 2012/0158671 A1 | 6/2012 | Tzur et al. | |
| 2013/0087297 A1 | 4/2013 | Wolin | |
| 2013/0311433 A1 | 11/2013 | Gero et al. | |
| 2014/0006858 A1 | 1/2014 | Helfman et al. | |
| 2014/0164352 A1* | 6/2014 | Denninghoff | H03H 9/02622 707/711 |
| 2014/0279953 A1 | 9/2014 | Aronovich | |
| 2015/0019510 A1* | 1/2015 | Aronovich | G06F 3/0644 707/692 |
| 2015/0019556 A1 | 1/2015 | Provenzano | |
| 2015/0019833 A1 | 1/2015 | Aronovich | |
| 2015/0106580 A1 | 4/2015 | Abercrombie et al. | |
| 2015/0142745 A1 | 5/2015 | Tekade et al. | |
| 2015/0142748 A1 | 5/2015 | Gottemukkula et al. | |
| 2015/0142750 A1 | 5/2015 | Mutalik et al. | |
| 2015/0143063 A1 | 5/2015 | Mutalik et al. | |
| 2015/0161194 A1 | 6/2015 | Provenzano et al. | |
| 2015/0178347 A1 | 6/2015 | Mutalik et al. | |
| 2015/0227600 A1 | 8/2015 | Ramu et al. | |
| 2015/0227601 A1 | 8/2015 | Ramu et al. | |
| 2015/0227602 A1 | 8/2015 | Ramu et al. | |
| 2015/0227890 A1 | 8/2015 | Bednarek et al. | |
| 2015/0228004 A1 | 8/2015 | Bednarek et al. | |
| 2015/0317157 A1 | 11/2015 | Gruber et al. | |
| 2016/0004716 A1 | 1/2016 | Akirav et al. | |
| 2016/0070714 A1 | 3/2016 | D'Sa et al. | |
| 2016/0077926 A1 | 3/2016 | Mutalik et al. | |
| 2016/0092552 A1 | 3/2016 | Morfonios et al. | |
| 2016/0132523 A1 | 5/2016 | Traeger | |
| 2016/0140004 A1 | 5/2016 | Flynn et al. | |
| 2017/0011120 A1* | 1/2017 | Cheung | G06F 16/334 |
| 2017/0068751 A1 | 3/2017 | Bulusu et al. | |

FOREIGN PATENT DOCUMENTS

JP       2012128845 A     7/2012
JP       2015521323 A     7/2015

OTHER PUBLICATIONS

Benjamin Zhu et al., "Avoiding the Disk Bottleneck in the Data Domain Deduplication File System", Fast vol. 8, 2008, total 14 pages.

Moinak Ghosh, "Scalable Data Deduplication using Similarity Matching and in-memory indexes", ip.com Disclosure No. IPCOM000226554D, ip.com Journal, ip.com Inc., West Henrietta, NY, US, Apr. 16, 2013, total 4 pages.

Bhagwat D et al: "Extreme Binning:Scalable, parallel deduplication for chunk-based file backup", Modeling, AnalysisandSimulation of Computer and Telecommunication Systems, 2009. Mascots "09. IEEE International Symposium on, IEEE, Piscataway, NJ, USA, Sep. 21, 2009, pp. 1-9, XP031640251.

Linux Defenders et al: "Optimizing Rolling Hash computation using SIMD Vector registers",Internet Citation, Apr. 16, 2013, XP002763854, 4 pages.

Anonymous: "GitHub-moinakg/pcompress: A Parallelized Data Deduplication and Compression utility", Oct. 3, 2015, XP055494979, 8 pages.

"SIMD," Wikipedia, XP055552011, pp. 1-8 (Apr. 14, 2016).
"Rolling hash," Wikipedia, XP055545390, pp. 1-6 (Jan. 21, 2016).
Kim et al., "File similarity evaluation scheme for multimedia data using partial hash information," Multimedia Tools and Applications, XP055323518, pp. 1-16 (Feb. 22, 2016).

* cited by examiner

VECTOR PROCESSING FOR SEGMENTATION HASH VALUES CALCULATION

CROSS-REFERENCE TO RELATED APPLICATIONS

This application is a continuation of International Application No. PCT/EP2016/058673, filed on Apr. 19, 2016, the disclosure of which is hereby incorporated by reference in its entirety.

BACKGROUND

The present disclosure, in some embodiments thereof, relates to segmenting an input data stream and, more specifically, but not exclusively, to segmenting an input data stream using vector processing.

Today, the volume of electronic data that needs to be stored or transferred between locations is rapidly increasing. Enormous quantities of data may present major cost and complexity challenges with respect to storage space for storing the data or network bandwidth for transferring it.

One solution commonly used for reducing the amount of data for storage or transfer is data deduplication (often called "intelligent compression" or "single-instance storage") which is a method of reducing the data volume by eliminating redundant data. While there are methods for file deduplication, block deduplication may present better results with respect to data compression. In block deduplication only one unique instance of a data segment (block) of a data stream is actually retained while redundant data segment(s) which are identical to the already retained data segment are replaced with a pointer to a copy of the retained data segment. Block deduplication processes a data stream that may be one of multiple data types, for example, data files, media files, stream data and the like to identify unique instances of one or more data segments (blocks). A unique number (hash value) is generated for each segment using a hash algorithm. A cryptographic strength hash algorithm is usually used for this purpose, for example, MD5 or SHA-1. The hash value generated for each segment is compared to existing hash values generated for previous segments and in case the hash value equals to an existing hash value, the segment is not retained but rather replaced with a pointer to the copy of the existing segment. Furthermore, in case the segment is updated, only the changed data may be retained while the remaining unchanged data which may include a significant amount of the segment is not retained.

One of the main challenges is effectively segmenting the data stream such that the segments are affected as little as possible by changes to the segments' data contents. Rolling hash techniques may be used for segmenting the data stream as known in the industry. Using a rolling hash, a hash value is calculated for shifting sequences of data in the data stream (in each rolling sequence an ending data item is omitted and a new data item is inserted). The calculated hash value is checked for compliance with pre-defined one or more segmentation criteria and in case the compliance is identified, the end of the respective rolling sequence is designated as a segment boundary or cut point.

SUMMARY

According to a first aspect of the present disclosure there is provided a system for segmenting an input data stream using vector processing, comprising a processor adapted to repeat the following steps throughout an input data stream to create a segmented data stream consisting a plurality of segments: apply a rolling sequence over a sequence of consecutive data items of an input data stream, the rolling sequence includes a subset of consecutive data items of the sequence; calculate, concurrently, a plurality of partial hash values, each by one of a plurality of processing pipelines of the processor, each for a respective one of a plurality of partial rolling sequences each including evenly spaced data items of the subset; determine compliance of each of the plurality of partial hash values with at least one respective partial segmentation criterion; and designate the sequence as a variable size segment when at least some of the plurality of partial hash values comply with the respective at least one partial segmentation criterion.

The term concurrent has thereby the meaning of overlapping in duration also including the meaning of simultaneous, e.g. happening at the same time.

According to a first implementation form of the first aspect of the present disclosure as such the processor is a single-instruction-multiple data, SIMD, processor.

According to a second implementation form of the first aspect as such or according to the first implementation form of the first aspect the processor is adapted to calculate each of the plurality of partial hash values as a partial rolling hash value using a respective partial hash value of a respective previous partial rolling sequence, an omitted data item which is omitted from the respective partial rolling sequence and an added data item which is added to the respective partial rolling sequence.

According to a third implementation form of the first aspect as such or according to any of the first or second implementation form of the first aspect the processor is adapted to designate the sequence as the variable size segment when a number of consecutive complying partial hash values calculated for successive subsets of the sequence which comply with the respective at least one partial segmentation criterion exceeds the number of the plurality of partial rolling sequences.

According to a fourth implementation form of the first aspect as such or according to any of the first to third implementation form of the first aspect the sequence includes a pre-defined minimum number of the consecutive data items.

According to a fifth implementation form of the first aspect as such or according to any of the first to fourth implementation form the processor is adapted to designate at least one large sequence of the plurality of sequences as the variable size segment when a size of the large sequence exceeds a pre-defined maximum value before detecting compliance of the partial hash values with the respective at least one partial segmentation criterion.

According to a second aspect of the present disclosure there is provided a method for segmenting an input data stream using vector processing, comprising using a processor adapted to repeat the following steps throughout an input data stream to create a segmented data stream consisting a plurality of segments: apply a rolling sequence over a sequence of consecutive data items of an input data stream, the rolling sequence includes a subset of consecutive data items of the sequence; calculate, concurrently, a plurality of partial hash values, each by one of a plurality of processing pipelines of processor, each for a respective one of a plurality of partial rolling sequences each including evenly spaced data items of the subset; determine compliance of each of the plurality of partial hash values with at least one respective partial segmentation criterion; and designate the sequence as a variable size segment when at least some of the plurality of partial hash values comply with the respective at least one partial segmentation criterion.

According to a first implementation form of the second aspect of the present disclosure as such each of the plurality of partial hash values is calculated as a partial rolling hash value using a respective partial hash value of a respective previous partial rolling sequence, an omitted data item which is omitted from the respective partial rolling sequence and an added data item which is added to the respective partial rolling sequence.

According to a second implementation form of the second aspect as such or according to the first implementation form of the second aspect the sequence is designated as the variable size segment when a number of consecutive complying partial hash values calculated for successive subsets of the sequence which comply with the respective at least one partial segmentation criterion exceeds the number of the plurality of partial rolling sequences.

According to a third implementation form of the second aspect as such or according to any of the first or second implementation form of the second aspect the sequence includes a pre-defined minimum number of the consecutive data items.

According to a fourth implementation form of the second aspect as such or according to any of the first to third implementation form of the second aspect at least one large sequence of the plurality of sequences is designated as the variable size segment when a size of the large sequence exceeds a pre-defined maximum value before detecting compliance of the partial hash values with the respective at least one partial segmentation criterion.

BRIEF DESCRIPTION OF THE DRAWINGS

Some embodiments of the disclosure are herein described, by way of example, with reference to the accompanying drawings. With specific reference now to the drawings in detail, it is stressed that the particulars shown are by way of example and for purposes of illustrative discussion of embodiments of the disclosure.

DETAILED DESCRIPTION

Figure 1:
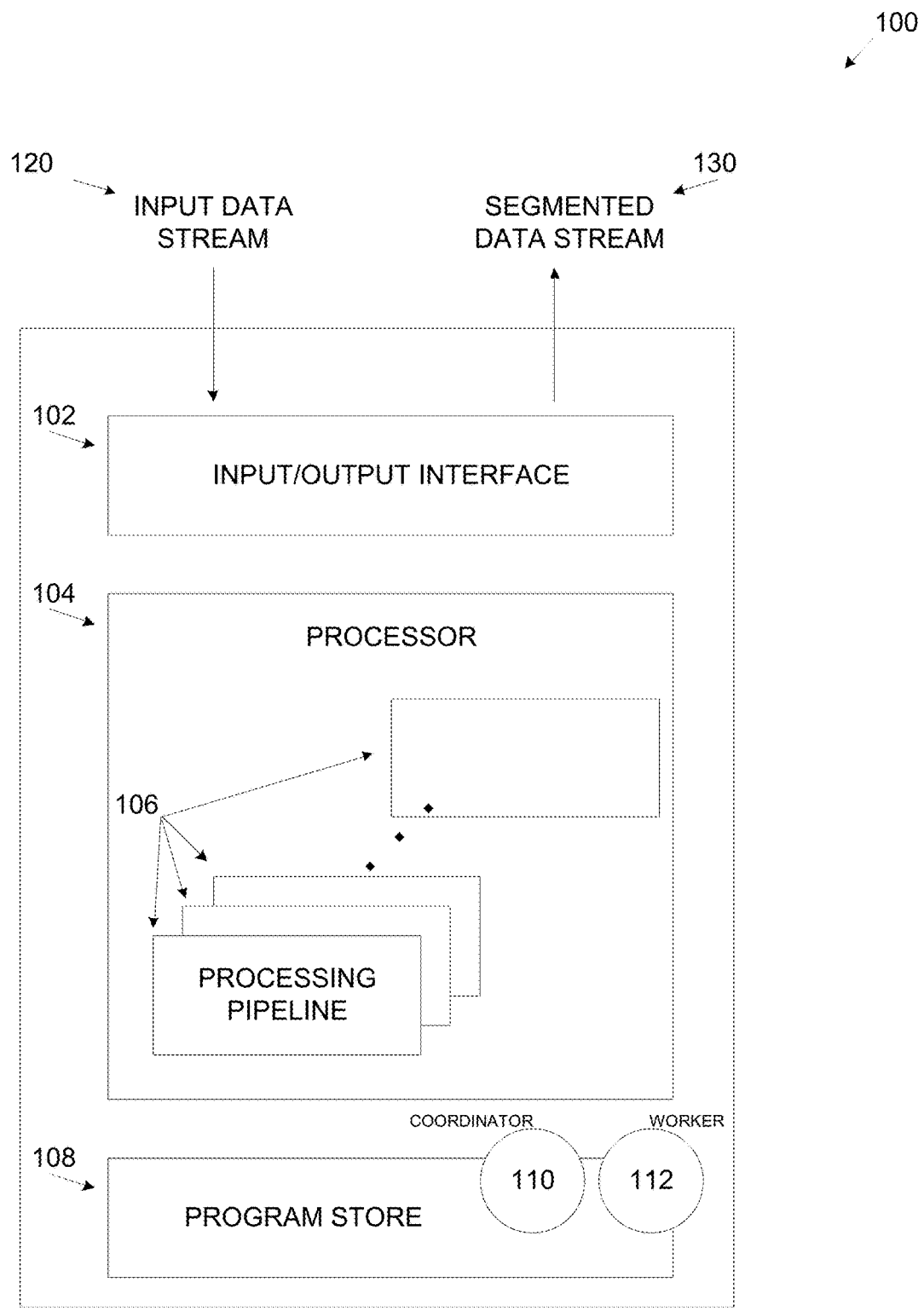
FIG. 1 is a schematic illustration of an exemplary system for segmenting an input data stream using vector processing, according to some embodiments of the present disclosure.

The present disclosure, in some embodiments thereof, relates to segmenting an input data stream and, more specifically, but not exclusively, to segmenting an input data stream using vector processing.

The present disclosure presents systems and methods for segmenting an input data stream using vector processing as part of a deduplication process applied to the input data stream in order to reduce the amount of data of the input data stream by removing redundant (duplicated) data segments. The deduplication process for reducing the amount of data of the input data stream, for example, data files, media files, streaming data and the like is performed in order to reduce storage space or network bandwidth required for storing or transferring the input data stream. The segmentation is done by concurrently or simultaneously processing a plurality of partial rolling sequences constituting a rolling sequence which is gradually shifted through a sequence of consecutive data items, for example, bytes, words, double-words or pixels of the input data stream. The partial rolling sequences are concurrently processed to calculate a partial rolling hash value for each of the partial rolling sequences. Each of the plurality of partial rolling hash values is calculated in a respective one of a plurality of processing pipelines of one or more vector processors, for example a single instruction multiple data (SIMD) processor. While the rolling sequence includes a subset of consecutive data items of the sequence, each of the plurality of partial rolling sequences includes evenly spaced data items of the subset of the rolling sequence. The sequence may be designated a variable size segment in case at least some of the partial rolling hash values calculated for each of the partial rolling sequences comply with (satisfy) respective one or more partial segmentation criteria. The process is repeated for a plurality of following rolling sequences throughout the input data stream to create a segmented data stream where each rolling sequence starts at the point where a previous rolling sequence ends.

Simultaneous segmentation using vector processing may present significant advantages compared to existing sequential segmentation methods. Vector processing technology is rapidly advancing in many aspects, for example, the number of processing pipelines available in modern processors, the number of data items that may be processed in parallel, and the processing power of the processor(s). While efficient segmentation of the input data stream may have a major contribution to the effectiveness of the entire deduplication process it may be one of the major time consuming and processor intensive operations of the deduplication process.

Since the data items of the input sequence may be regarded as independent from each other with respect to calculating the hash value for the rolling sequences, simultaneous processing of the partial rolling sequences as part of the segmentation process may take full advantage of the vector processing technology such as a processor(s) having the SIMD engine. Processing the input data stream using the vector processor(s) may significantly reduce the segmentation time compared to the sequential segmentation employed by current segmentation methods. As the segmentation time is significantly reduced, the entire deduplication process may be significantly shortened and may possibly remove bottlenecks in data transfer and data storage operations.

Before explaining at least one embodiment of the disclosure in detail, it is to be understood that the disclosure is not necessarily limited in its application to the details of construction and the arrangement of the components and methods set forth in the following description and illustrated in the drawings and the Examples. The disclosure is capable of other embodiments or of being practiced or carried out in various ways.

The present disclosure may be a system, a method, and a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing.

Computer readable program instructions described herein can be downloaded to respective computing/processing devices from a computer readable storage medium or to an external computer or external storage device via a network, for example, the Internet, a local area network, a wide area network or a wireless network.

The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (e.g., through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and block diagrams of methods, apparatus (systems), and computer program products according to embodiments of the disclosure. It will be understood that each block of the flowchart illustrations and block diagrams, and combinations of blocks in the flowchart illustrations and block diagrams, can be implemented by computer readable program instructions.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and flowchart illustration, and combinations of blocks in the block diagrams and flowchart illustration, can be implemented by special purpose hardware-based systems that perform the specified functions or acts or carry out combinations of special purpose hardware and computer instructions.

Reference is now made to FIG. 1, which is a schematic illustration of an exemplary system 100 for segmenting an input data stream using vector processing, according to some embodiments of the present disclosure. A system 100 includes an input/output (I/O) interface 102 for receiving and designating an input data stream 120 and outputting a segmented data stream 130, a processor(s) 104 comprising a plurality of processing pipelines 106 for segmenting the input data stream 120 to create the segmented data stream 130 and a program store 108. The input data stream 120 may be received in one or more formats, for example, a data file, a media file, a streaming data and the like. The input data stream 120 includes a plurality of data items, for example, bytes, words, double-words or pixels which may be arranged in sequence as a stream. The I/O interface 102 may include one or more interfaces, for example, a network interface, a memory interface or a storage interface. The I/O interface 102 may be used, for example, for receiving and transmitting the data streams 120 and 130 over a network, for fetching and storing the data streams 120 and 130 to a memory device and a storage device and the like. The processor(s) 104 may include one or more processors each having one or more cores. The processor(s) 104 further includes vector processing capabilities such as the plurality of processing pipelines 106. The processing pipelines 106 support multiple independent execution pipelines each capable of processing data, for example, multiple processors, multiple cores or vector processors, for example, a SIMD processor or a SIMD engine. The SIMD engine comprises a plurality of processing pipelines 106 capable of concurrently processing multiple data items at a single instruction of the processor(s) 104. The program store 108 may include one or more non-transitory persistent storage devices, for example, a hard drive, a Flash array and the like.

Figure 2:
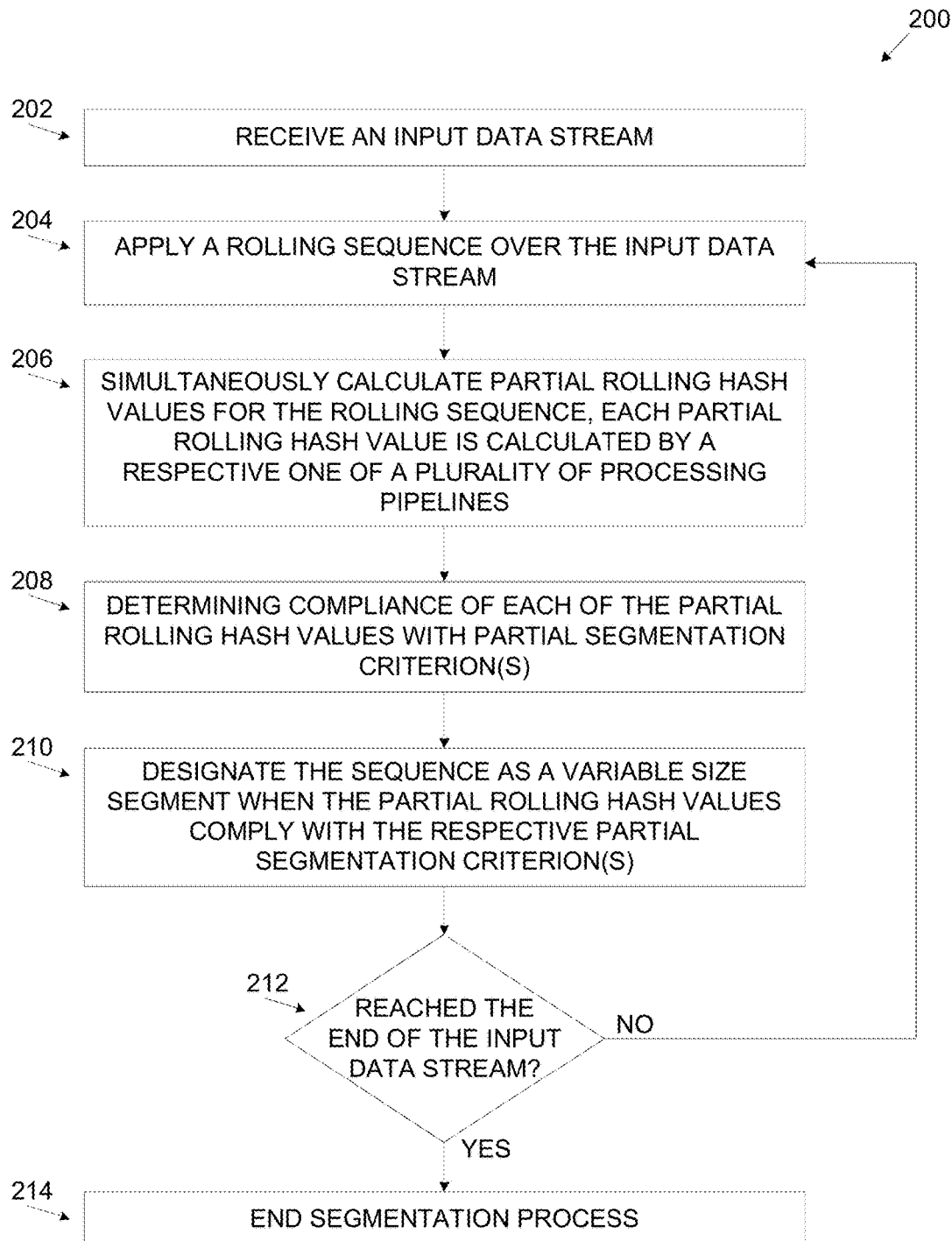
FIG. 2 is a flowchart of an exemplary process for segmenting an input data stream using vector processing, according to some embodiments of the present disclosure.

Reference is also made to FIG. 2, which is a flowchart of an exemplary process for segmenting an input data stream using vector processing, according to some embodiments of the present disclosure. A segmentation process 200 for segmenting an input data stream may be performed by a system such as the system 100. The segmentation process 200 employs the plurality of processing pipelines 106 to concurrently process partial sequences of the input data stream 120 to produce the segmented data stream 130.

The segmentation process 200 may be done by one or more software modules such as, for example, a coordinator 110 and/or a worker 112 which comprise a plurality of program instructions executed by the processor(s) 104 and/ or the processing pipelines 106 from the program store 108. Optionally, the workers 112 may include one or more microcode modules embedded with the processing pipelines 106, where the microcode modules include program instructions executed by the processing pipelines 106. The coordinator 110 may be executed, for example, by a processing unit of the processor(s) 104. The coordinator 110 may manage and coordinate the segmentation process, for example, distribute data between the pluralities of processing pipelines 106, collect data from the plurality of processing pipelines 106, synchronize data, synchronize tasks, coordinate the workers 112, designate segments and the like. The processor(s) 104 and/or each of the processing pipelines 106 may execute an instance of a plurality of workers 112 to process concurrently the partial sequences of the input data stream 120. In case the processor(s) 104 is a vector processor comprising the processing pipelines 106 that are independent processing units, each processing pipeline 106 may independently execute a worker 112 instance. However, in case the processor(s) 104 incorporates the SIMD engine, the worker 112 may be executed by the processor(s) 104 that assigns data to each of the processing pipelines 106 of the SIMD engine. The processor(s) 104 may then initiate a single instruction to instruct all the processing pipelines 106 of the SIMD engine to concurrently execute the same operation (instruction), each processing pipeline 106 processing its respective assigned data.

As shown at 202, the process 200 starts with the coordinator 110 receiving the input data stream 120 from the I/O interface 102.

Before explaining the simultaneous segmentation process using the vector processing, the segmentation process using rolling sequences and rolling hash is first described.

Figure 3A:
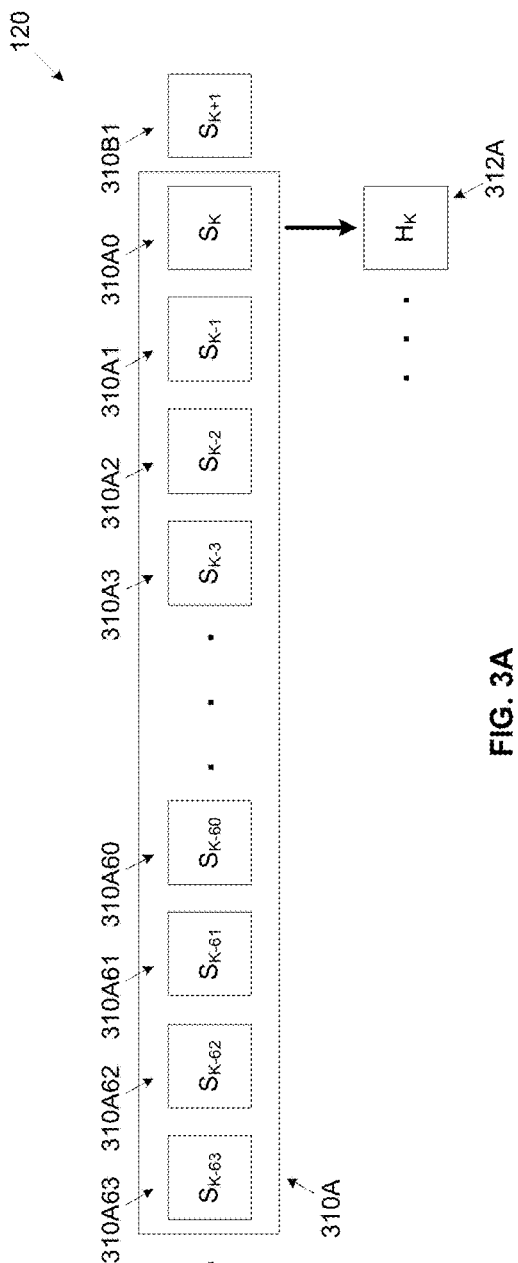
FIG. 3A is a schematic illustration of an exemplary process of calculating rolling hash values for segmenting an input data stream.
Figure 3B:
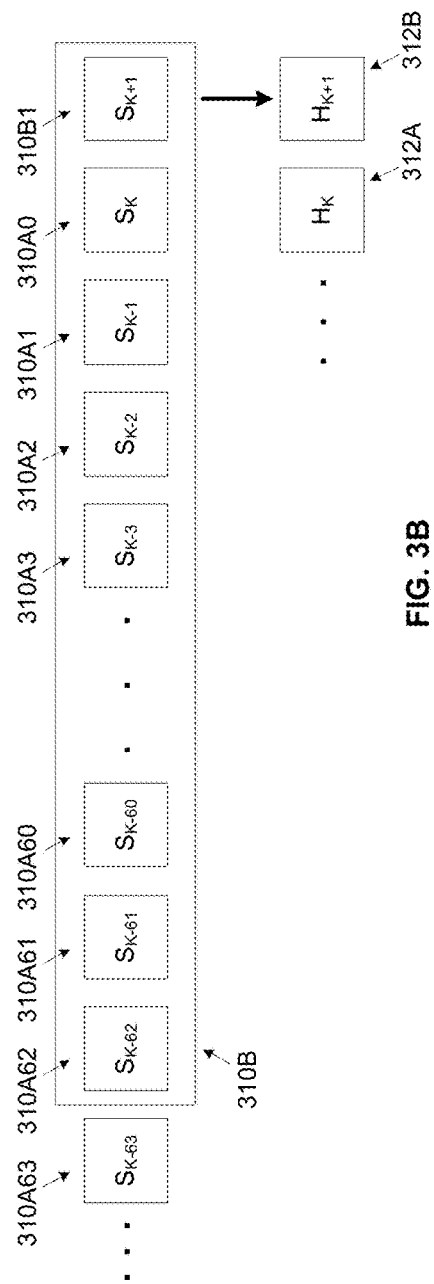
FIG. 3B is a schematic illustration of an exemplary process of calculating rolling hash values for segmenting an input data stream.

Reference is now made to FIG. 3A and FIG. 3B which are schematic illustrations of an exemplary process of calculating rolling hash values for segmenting an input data stream. An input data stream 120 is processed by applying a shifting rolling sequence over the input data stream 120 comprising a plurality of data items, for example, bytes, words, double words, pixels and the like. The rolling sequences are shifted over the input data stream 120 starting at the beginning of the data stream 120 and shifted towards the end of the input data stream 120. The rolling sequence is shifted until a segment is identified and designated. Once a segment is designated, a following sequence starts from the end of the previous designated segment and a respective rolling sequence is shifted towards the end of the input data stream 120. This process is repeated until the entire input data stream is segmented to produce the segmented data stream 130. The number of the data items included in the rolling sequences may vary according to one or more aspects, for example, segmentation requirements, data throughput, processing power and the like. The exemplary input data stream 120 is processed with rolling sequences each comprising 64 data items, however as explained the number of data items may be different. A hash value $H_K$ 312A is calculated for the rolling sequence rolling sequence 310A which includes data items $S_K$ 310A0 through $S_{K-63}$ 310A63. The rolling sequence is then shifted to the left to define the rolling sequence 310B such that the data item $S_{K-63}$ 310A63 is omitted and a new data item $S_{K+1}$ 310B1 is added. A new hash value $H_{K+1}$ 312B is calculated for the rolling sequence 310B which includes data items $S_{K+1}$ 310B1 through $S_{K-62}$ 310A62. The rolling sequence is shifted through the sequence of the input data stream 120 until a segment is detected as explained hereinafter. The hash values $H_K$ 312A and $H_{K+1}$ 312B as well as following hash values calculated for the following sequences of the input data stream 120 may be calculated using one of many rolling hash functions, for example, a Rabin-Karp rolling hash or a Buzhash.

While it is possible to calculate the hash values such as the hash values $H_K$ 312A and $H_{K+1}$ 312B from their respective rolling sequences such as the rolling sequences 310A and 310B, it is evident from the above, that each of the hash values $H_K$ 312A and $H_{K+1}$ 312B depends on a previous hash value, an omitted data item from the respective sequence and an added data item to the respective sequence. Each hash value may therefore be considered as a rolling hash value and may be calculated using the values of the previous hash value, the omitted data item and the added data item thus avoiding redundant complex computation of the entire respective rolling sequence such as the rolling sequences 310A and 310B.

Figure 3C:
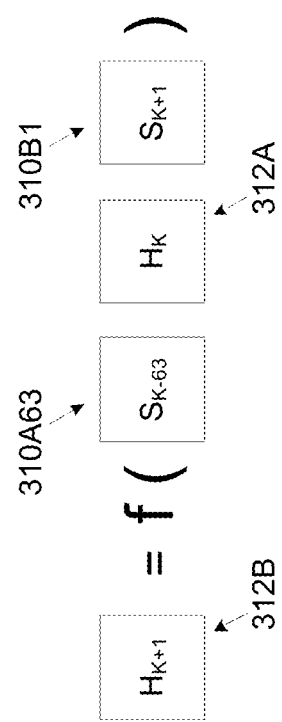
FIG. 3C is an exemplary formulation of rolling hash values calculation for segmenting an input data stream.

Reference is now made to FIG. 3C which is an exemplary formulation of rolling hash values calculation for segmenting an input data stream. A rolling hash value such as the rolling hash value $H_{K+1}$ 312B for a respective rolling sequence such as the rolling sequence 310B applied to a sequence of an exemplary input stream such as the input stream 120 may be calculated as a function of a previous hash value such as the hash value $H_K$ 312A, an omitted data item such as the omitted data item $S_{K-63}$ 310A63 and an added data item such as the added data item $S_{K+1}$ 310B1.

Each of the hash values such as the hash values $H_K$ 312A and $H_{K+1}$ 312B is compared for compliance against one or more segmentation criteria to identify a point in which the sequence is "cut" to designate a segment. The one or more segmentation criteria may define for example, a data pattern such as, for example, checking that the last 12 bits of the hash value equal a pre-defined value. This will typically produce a "cut" on average once every 4,096 bytes. Naturally, the size of the segment is variable and depends on the location within the sequence in which the calculated rolling hash value complies with the one or more segmentation criteria. A minimum size may be pre-defined for each of the plurality of variable size segments such that the processed sequence of the input data stream 120 starts from a minimum block size and increases until "cut". A maximum size may be pre-defined for each of the plurality of variable size segments such that if the pre-defined maximum size is reached before identifying a "cut" point in the processed sequence, the segment is "cut" even if the hash value does not comply with the one or more segmentation criteria.

The segmentation process continues over following sequences of the input data stream 120 to the end of the input data stream 120 to create a segmented data stream such as the segmented data stream 130.

Reference is made once again to FIG. 2. As shown at 204, the coordinator 110 applies a rolling sequence such as the rolling sequences 310A and 310B over a sequence of consecutive data items of an input stream such as the input stream 120. The coordinator 110 selects the first sequence to start from the beginning of the input data stream 120 and advances towards the end of the input data stream 120. The coordinator 110 shifts the rolling sequences such as the rolling sequences 310A and 310B over the processed sequence. As discussed above, the number of data items included in each of the rolling sequences, for example, 32, 64 and 128 depends on one or more aspects of the segmentation process and/or of processing resources characteristics and/or capabilities.

As shown at 206, the coordinator 110 splits the rolling sequence to a plurality of partial rolling sequences which are concurrently (concurrently) processed, each by a respective one of the plurality workers 112 each executed by a respective one of the processing pipelines 106. In case the process 200 is performed by the processor(s) 104 having the SIMD engine, the worker 112 is executed by the processor(s) 104 that assigns data of the respective partial rolling sequence to each of the processing pipelines 106 of the SIMD engine. The number of the partial rolling sequences is set to fit the number of available processing pipelines 106, for example, 4, 8, 16, 32, 64 and/or 128. Each of the partial rolling sequences includes evenly spaced data items of the subset of the rolling sequence such as the rolling sequences 310A and 310B. For example, the rolling sequences 310A and 310B are split to 4 partial rolling sequences to fit 4 workers 112 executed by a vector processor(s) 104 having 4 processing pipelines such as the processing pipelines 106 or a vector processor(s) 104 with a SIMD engine having 4 processing pipelines 106. Each partial rolling sequence of the rolling sequences 310A and 310B includes every 4th data item of the rolling sequence 310A or 310B. A first partial rolling sequence may comprise data items 0, 4, 8 . . . , a second data sub-stream may comprise data items 1, 5, 9 . . . , a third data sub-stream may comprise data items 2, 6, 10 . . . and a fourth data sub-stream may comprise data items 3, 7, 11 . . . . Similarly, as another example, in case the rolling sequences 310A and 310B are split to 8 partial rolling sequences to fit 8 workers 112 executed by a vector processor(s) 104 having 8 processing pipelines such as the processing pipelines 106 and 8 SIMD processing pipelines 106, each partial rolling sequence includes every 8th data item of the subset of the rolling sequence. The first partial rolling sequence may comprise data items 0, 8, 16 . . . , the second partial rolling sequence may comprise data items 1, 9, 17 . . . , the third partial rolling sequence may comprise data items 2, 10, 18 . . . the fourth partial rolling sequence may comprise data items 3, 11, 19 . . . a fifth partial rolling sequence may comprise data items 4, 12, 20 . . . a sixth partial rolling sequence may comprise data items 5, 13, 21 . . . a seventh partial rolling sequence may comprise data items 6, 14, 22 . . . and an eighth partial rolling sequence may comprise data items 7, 15, 23 and so on. Similarly, the coordinator 110 may split the sequence to 16, 32, 64, 128, 256 and the like to fit the number of available workers 112, i.e. the number of available processing pipelines 106.

Each of the workers 112 executed by a respective one of the plurality of processing pipelines 106 processes a respective partial rolling sequence to calculate a partial rolling hash value for respective partial rolling sequences. The workers 112 may calculate the partial hash values using one of many rolling hash functions, for example, a Rabin-Karp rolling hash and/or a Buzhash. The plurality of workers 112 process their respective partial rolling sequence concurrently such that all partial rolling sequences are processed concurrently. For the processor(s) 104 having the SIMD engine, the worker 112 executed by the processor(s) 104 initiates a single command (instruction) to instruct all the SIMD engine processing pipelines 106 to concurrently calculate the partial rolling hash values of their respective partial rolling sequences.

Figure 4A:
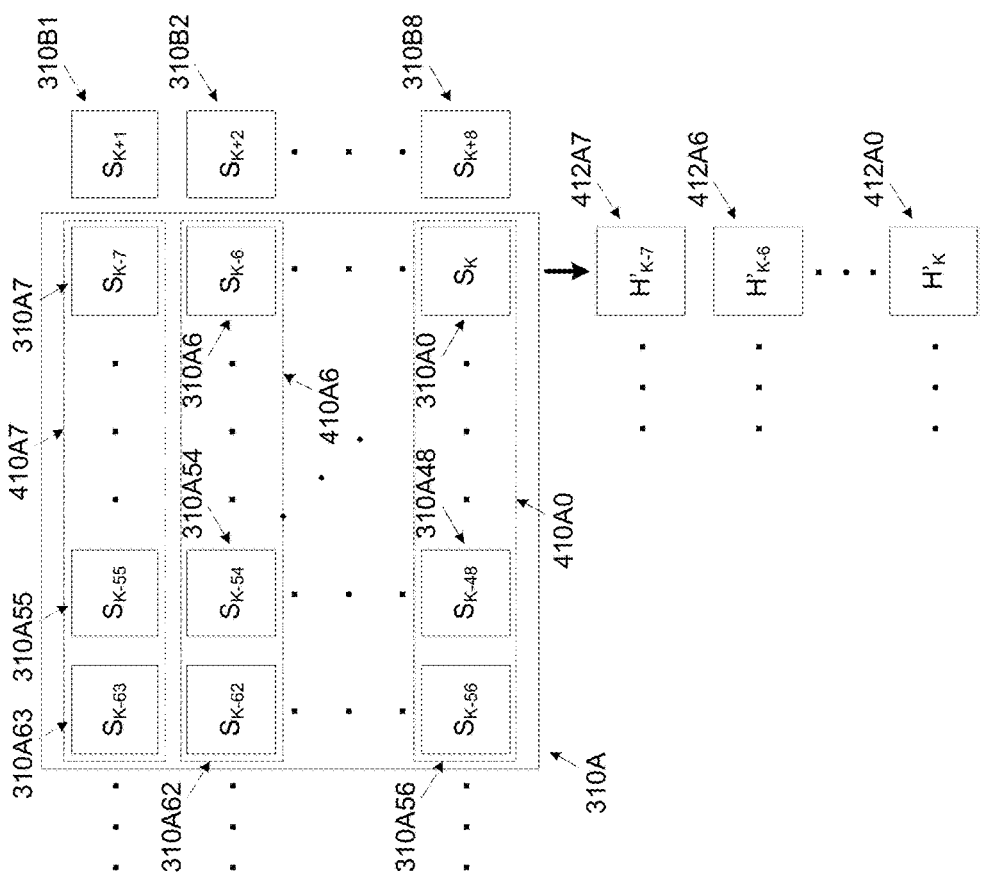
FIG. 4A is a schematic illustration of an exemplary process of calculating partial rolling hash values for segmenting an input data stream using vector processing, according to some embodiment of the present disclosure.
Figure 4B:
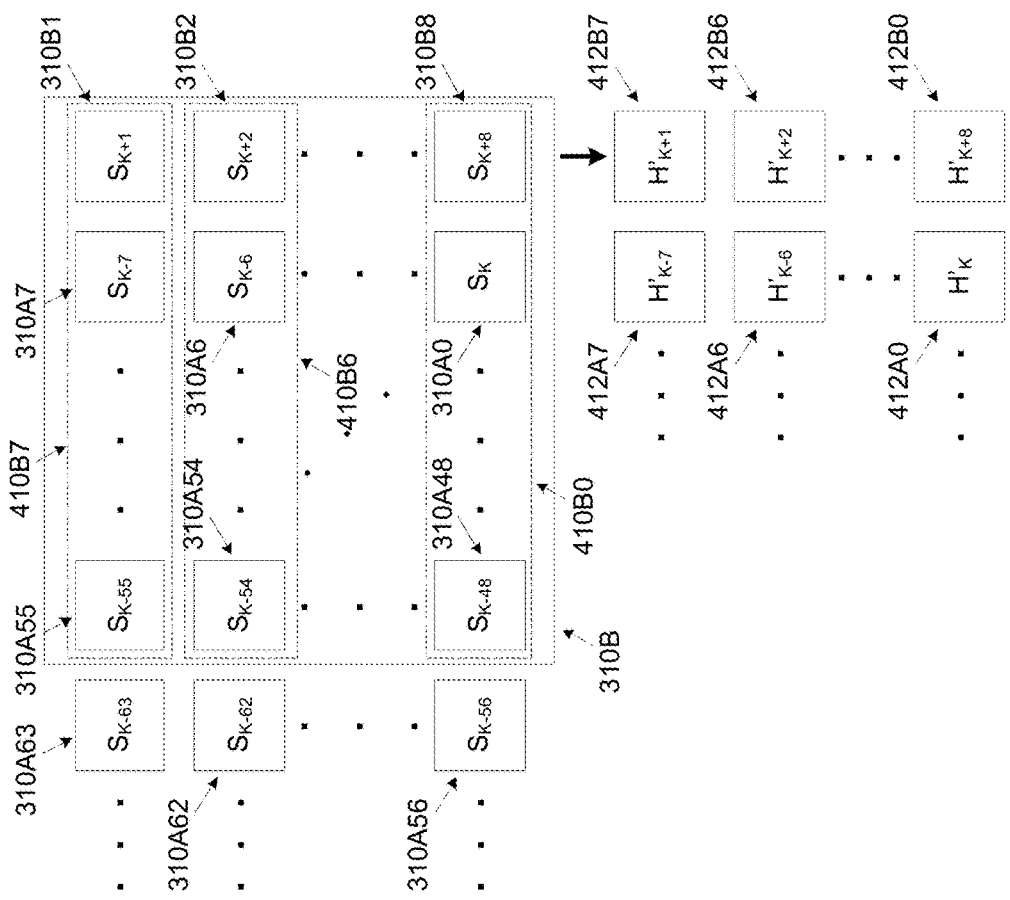
FIG. 4B is a schematic illustration of an exemplary process of calculating partial rolling hash values for segmenting an input data stream using vector processing, according to some embodiment of the present disclosure.

Reference is now made to FIG. 4A and FIG. 4B which are schematic illustrations of an exemplary process of calculating partial rolling hash values for segmenting an input data stream using vector processing, according to some embodiment of the present disclosure.

As seen in FIG. 4A, the coordinator 110 splits a rolling sequence such as the rolling sequence 310A to 8 partial rolling sequences 410A0 through 410A7 to fit an exemplary vector processor(s) 104 having 8 processing pipeline 106. The coordinator 110 may distribute the partial rolling sequences 410A0 through 410A7 to 8 respective workers 112. For the processor(s) 104 having the SIMD engine, a single worker 112 executed by the processor(s) 104 assigns each of the SIMD engine processing pipelines 106 with data of the respective one of the partial rolling sequences 410A0-410A7. However, as presented herein above the number of partial rolling sequences may be different according to the number of workers 112 and/or available processing pipelines 106. Each of the partial rolling sequences 410A0 through 410A7 is processed by a respective worker 112 executed by a respective one of the plurality of processing pipelines 106. For the processor(s) 104 having the SIMD engine, the SIMD engine processing pipelines 106 concurrently process the respective partial rolling sequences 410A0-410A7 at a single instruction by the worker 112 (executed by the processor(s) 104).

The exemplary process 200 presented herein follows the example presented herein before where the each of the rolling sequences such as the rolling sequence 310A comprises a subset of 64 data items hence the coordinator 110 splits the rolling sequence 310A to 8 partial rolling sequences 410A0 through 410A7 each including 8 data items. Therefore, the exemplary partial rolling sequences 410A0 includes 8 data items $S_K$ 310A0, $S_{K-8}$ 310A8, $S_{K-16}$ 310A16, $S_{K-24}$ 310A24, $S_{K-32}$ 310A32, $S_{K-40}$ 310A40, $S_{K-48}$ 310A48 and $S_{K-56}$ 310A56, the exemplary partial rolling sequences 410A7 includes 8 data items $S_{K-7}$ 310A7, $S_{K-15}$ 310A15, $S_{K-23}$ 310A23, $S_{K-31}$ 310A31, $S_{K-39}$ 310A39, $S_{K-47}$ 310A47, $S_{K-55}$ 310A55 and $S_{K-63}$ 310A63 and so on. It is emphasized once again that each of the plurality of partial rolling sequences such as the partial rolling sequences 410A0 through 410A7 each includes 8 data items, however the number of data items may vary according to one or more aspects, for example, a segmentation requirement, a hash function(s) type, a data throughput, a processor(s) architecture and the like. The processor(s) architecture may include one or more characteristics, for example, a register's width, a cache line width, a memory interface width and/or speed, a network interface width and/or speed, a storage media interface width and/or speed and the like.

The eight workers 112 concurrently process the eight partial rolling sequences 410A0 through 410A7 to calculate a partial rolling hash value such as partial rolling hash values $H'_K$ 412A0 through $H'_{K-7}$ 412A7 for each of the respective partial rolling sequences 410A0 through 410A7. Additionally and/or alternatively, in case the processor(s) 104 include the SIMD engine, the worker 112 executed by the processor(s) 104 instructs the eight SIMD engine processing pipelines 106 process the eight partial rolling sequences 410A0 through 410A7. The eight SIMD engine processing pipelines 106 calculate the partial rolling hash values $H'_K$ 412A0 through $H'_{K-7}$ 412A7 for each of the respective one of the partial rolling sequences 410A0-410A7. The worker(s) 112 may use one or more hash functions, for example, Rabin-Karp or Buzhash to calculate the partial rolling hash values $H'_K$ 412A0 through $H'_{K-7}$ 412A7.

As seen in FIG. 4B, each of the processing pipelines 106 shifts the partial rolling sequences to the right to create partial rolling sequences 410B0 through 410B7 such that the left most data item of each of the previous rolling sequences 410A0-410A7 is omitted and a new data item is added. For example, the partial rolling sequence 410B0 corresponds to a shifted partial rolling sequence 410A0 in which the data item $S_{K-56}$ 310A56 is omitted and a new data item $S_{K+8}$ 310B8 is added. Similarly, the partial rolling sequence 410B7 corresponds to a shifted partial rolling sequence 410A7 in which the data item $S_{K-63}$ 310A63 is omitted and a new data item $S_{K+1}$ 310B1 is added.

The eight processing pipelines 106 concurrently process their respective partial rolling sequences 410B0-410B7 to calculate a partial hash value such as the hash values $H'_{K+8}$ 412B0 through $H'_{K+1}$ 412B7 for each of the respective partial rolling sequences 410B0-410B7.

Similarly to hash values such as the hash values $H_K$ 312A and $H_{K+1}$ 312B, each of the partial hash values such as the partial hash values $H'_K$ 412A0-$H'_{K-7}$ 412A7 and $H'_{K+8}$ 412B0-$H'_{K+1}$ 412B7 may be calculated for their respective partial sequences 410A0-410A7 and 410B0-410B7. However as evident from the above, each of the partial hash values $H'_K$ 412A0-$H'_{K-7}$ 412A7 and $H'_{K+8}$ 412B0-$H'_{K+1}$ 412B7 depends on a previous respective partial hash value, an omitted data item from the respective partial rolling sequence and an added data item to the respective partial rolling sequence. Each partial hash value $H'_K$ 412A0-$H'_{K-7}$ 412A7 and $H'_{K+8}$ 412B0-$H'_{K+1}$ 412B7 may therefore be considered as a rolling hash. The worker(s) 112 may therefore calculate the partial hash value $H'_K$ 412A0-$H'_{K-7}$ 412A7 using the values of the previous respective partial hash value, the respective omitted data item and the respective added data item thus avoiding redundant computation of the entire respective partial rolling sequence 410A0-410A7 and/or 410B0-410B7.

Figure 4C:
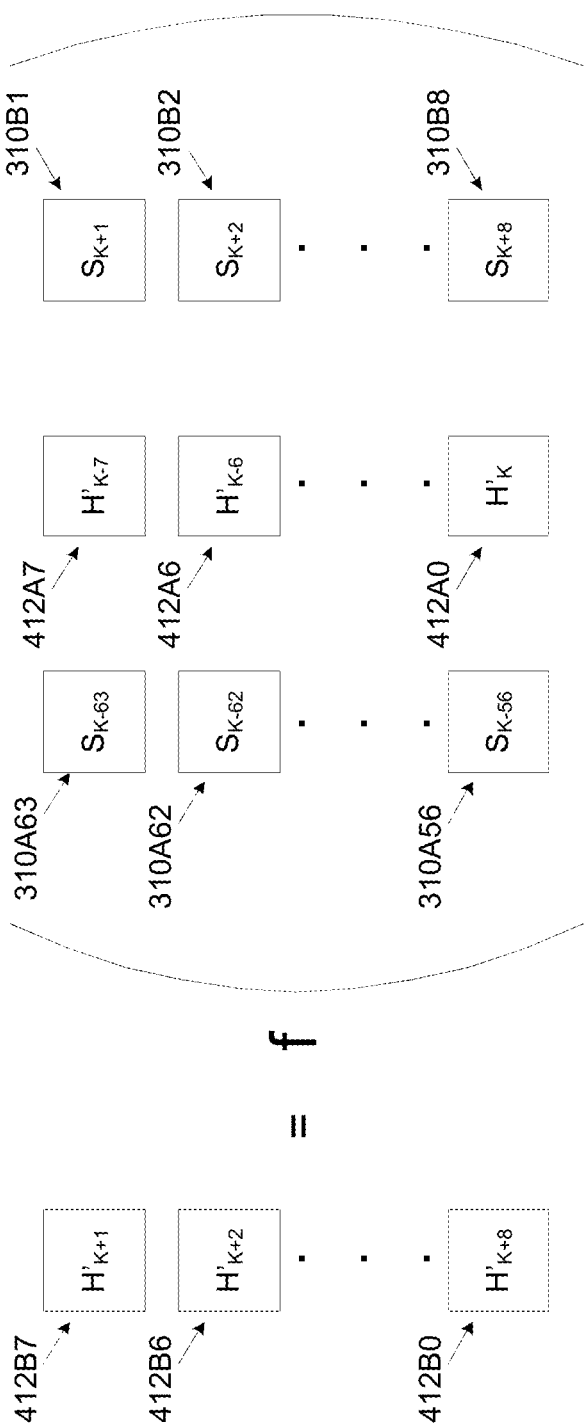
FIG. 4C is a schematic illustration of an exemplary formulation of partial rolling hash values calculation for segmenting, according to some embodiments of the present disclosure.

Reference is now made to FIG. 4C which is an exemplary formulation of partial rolling hash values calculation for segmenting an input data stream, according to some embodiment of the present disclosure. A respective processing pipeline 106 may calculate a partial rolling hash value such as the partial rolling hush value $H'_{K+1}$ 412B7 for a respective partial rolling sequence such as the partial rolling sequence 410B7, as a function of a previous partial rolling hash value such as the partial rolling hash value $H'_{K-7}$ 412A7, an omitted data item such as the omitted data item $S_{K-63}$ 310A63 and an added data item such as the added data item $S_{K+1}$ 310B1. Similarly, each of the other processing pipelines 106 may calculate the partial rolling hash values $H'_{K+2}$ 412B6 through $H'_{K+8}$ 412B0 using the same methodology.

Reference is made once again to FIG. 2. As shown at 208, each of the calculated partial rolling hash values is checked for compliance with and/or satisfies respective one or more partial segmentation criteria to determine if the complete sequence comprising the rolling sequences such as the rolling sequences 310A and 310B (each comprising the respective partial rolling sequences) may be designated as a segment. Each of the respective partial hash values such as the partial rolling hash values $H'_K$ 412A0-$H'_{K-7}$ 412A7 and/or $H'_{K+8}$ 412B0-$H'_{K+1}$ 412B7 are checked for compliance to identify a point in which the sequence may be "cut" to designate a segment. The one or more partial segmentation criteria may define, for example, a data pattern such as the partial rolling hash value 412 is larger than a predefined value and/or a predefined number of bits in the partial rolling hash value 412 equal a predefined value. The number of consecutive partial hash values that each complies with the respective partial segmentation criteria affects the average segment size. The number of consecutive partial hash values that are required to comply with their respective partial segmentation criteria may vary according to a maximum allowed and/or desired data segment size.

As shown at 210, in case the partial rolling hash values comply with the respective partial segmentation criterion(s), the coordinator 110 may "cut" the sequence on which the rolling sequence is shifted (and which comprises the partial rolling sequences) and designates the sequence as a data segment. The coordinator 110 may use one or more segmentation criteria for "cutting" the sequence and designating it as a segment where the segmentation criterion is a combination of the one or more partial segmentation criteria.

Naturally, the size of the segment is variable and depends on the location within the sequence in which compliance is identified for the respective calculated partial rolling hash values with the respective one or more partial segmentation criteria. Typically, for data deduplication, the average size of the data segments may be, for example, 4 kilo bytes (KB), 6 KB and/or 8 KB which may best fit current processing, storage and/or networking throughput and performance such that the overhead of processing the data segments is optimized with respect to the number of segments.

Optionally, a minimum size may be pre-defined for each of the plurality of variable size segments such that the partial rolling sequences starts from a minimum block size and increases until "cut". Based on the typical segment size, the pre-defined minimum size may be for example, 2 KB.

Optionally, a maximum size may be pre-defined for each of the plurality of variable size segments such that if the pre-defined maximum size is reached before identifying a "cut" point, the segment is "cut" even if the hash value does not match the one or more segmentation criteria. Based on the typical segment size, the pre-defined maximum size may be for example, 16 KB.

Figure 5A:
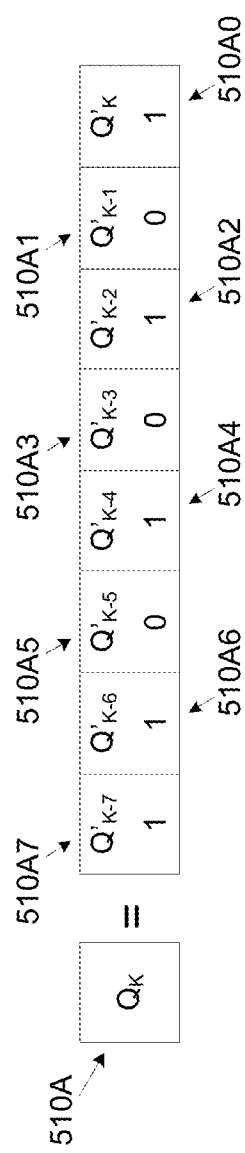
FIG. 5A is a schematic illustration of an exemplary process of qualifying partial rolling hash values with partial segmentation criteria, according to some embodiments of the present disclosure.
Figure 5B:
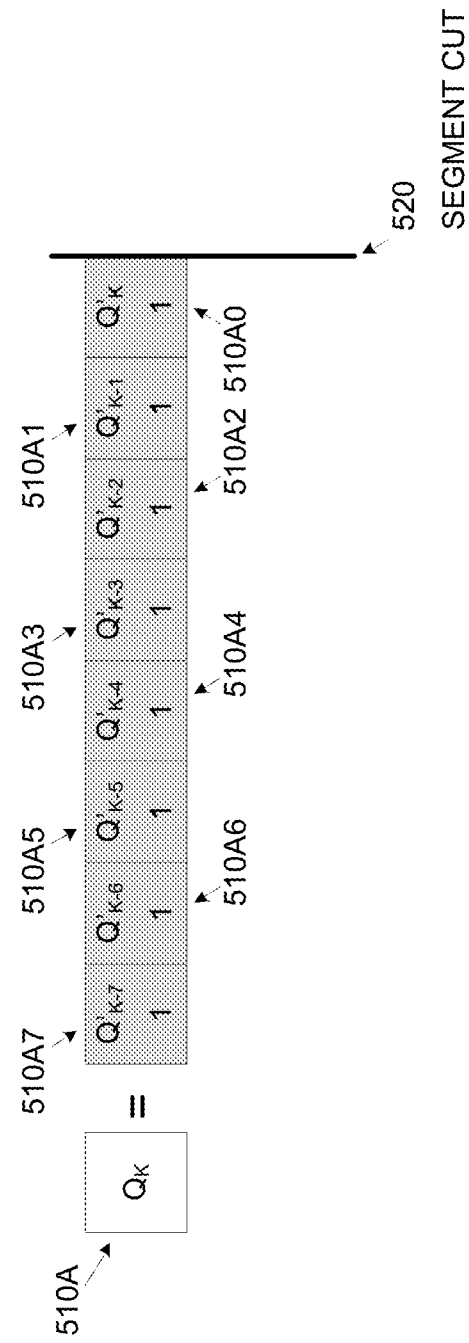
FIG. 5B is a schematic illustration of an exemplary process of qualifying partial rolling hash values with partial segmentation criteria, according to some embodiments of the present disclosure.

Reference is now made to FIGS. 5A and 5B which are schematic illustrations of an exemplary process of qualifying partial rolling hash values with partial segmentation criteria, according to some embodiment of the present disclosure. The coordinator 110 may identify compliance with a segmentation criterion when the workers 112 identify compliance of their respective partial rolling hash value associated with one of a plurality of partial rolling sequences with the respective partial segmentation criteria. In case the processor(s) 104 has the SIMD engine, the worker 112 executed by the processor(s) collects the partial rolling hash values each calculated by a respective one of the SIMD processing pipelines 106 and compares the partial rolling hash values against the respective partial segmentation criteria. For example, in case partial rolling hash values such as the partial rolling hash values $H'_K$ 412A0-$H'_{K-7}$ 412A7 of respective partial rolling sequences such as the partial rolling sequences 410A0-410A7 all comply with respective partial segmentation criteria, the coordinator 110 may designate the sequence to the point of data item $S_K$ 310A0 as a segment.

As shown in FIG. 5A, $Q_K$ 510A is a segmentation criteria which is a combination of a set of partial segmentation criteria $Q'_{K-7}$ 510A7-$Q'_K$ 510A0 where a "1" indicates compliance of the respective partial hash value with the respective partial segmentation criteria and "0" indicates non-compliance of the respective partial hash value with the respective one or more partial segmentation criteria. For example, the partial segmentation criterion $Q'_{K-7}$ 510A7 indicates compliance of the partial hash value $H'_{K-7}$ 412A7. Since the partial segmentation criteria $Q'_{K-5}$ 510A5, $Q'_{K-3}$ 510A3 and $Q'_{K-1}$ 510A1 do not comply with the respective partial segmentation criteria, the entire segmentation criterion $Q_K$ 510A is not met.

On the other hand, as shown in FIG. 5B all the partial segmentation criteria $Q'_{K-7}$ 510A7-$Q'_K$ 510A0 comply with their respective partial segmentation criteria and therefore the entire segmentation criterion $Q_K$ 510A is met and a "cut"

520 is made to designate the sequence which includes the rolling sequences comprising the respective partial rolling sequences as a segment.

Optionally, the coordinator 110 checks for compliance of consecutive partial rolling hash values of successive rolling sequences, for example, a previous rolling sequence and/or a subsequent rolling sequence with the respective partial segmentation criteria. The number of consecutive partial hash values that need to comply with the respective partial segmentation criteria may exceed the number of partial rolling hash values (which is naturally the number of partial rolling sequences and the number of the processing pipelines 106). The compliance of the rolling sequence with the segmentation criteria is therefore a function of compliance of the partial hash values of the successive partial rolling sequences. As discussed above, the number of consecutive partial rolling hash values that are checked for compliance with the partial segmentation criteria may be set to fit the required and/or desired typical data segment size since the number of the consecutive complying partial rolling hash values affects the average segment size. The example, presented herein presents compliance of 8 consecutive partial rolling hash values with the respective partial segmentation criteria, however other numbers of consecutive partial rolling hash values may be used according to the required/desired typical size of the data segments.

By checking for compliance of consecutive partial hash values of two successive groups of partial rolling sequences the coordinator may present an additional advantage as the resolution and/or granularity for segmenting the sequence is increased compared to identifying compliance of an original rolling sequence such as the rolling sequences 310A and/or 310B.

Figure 5C:
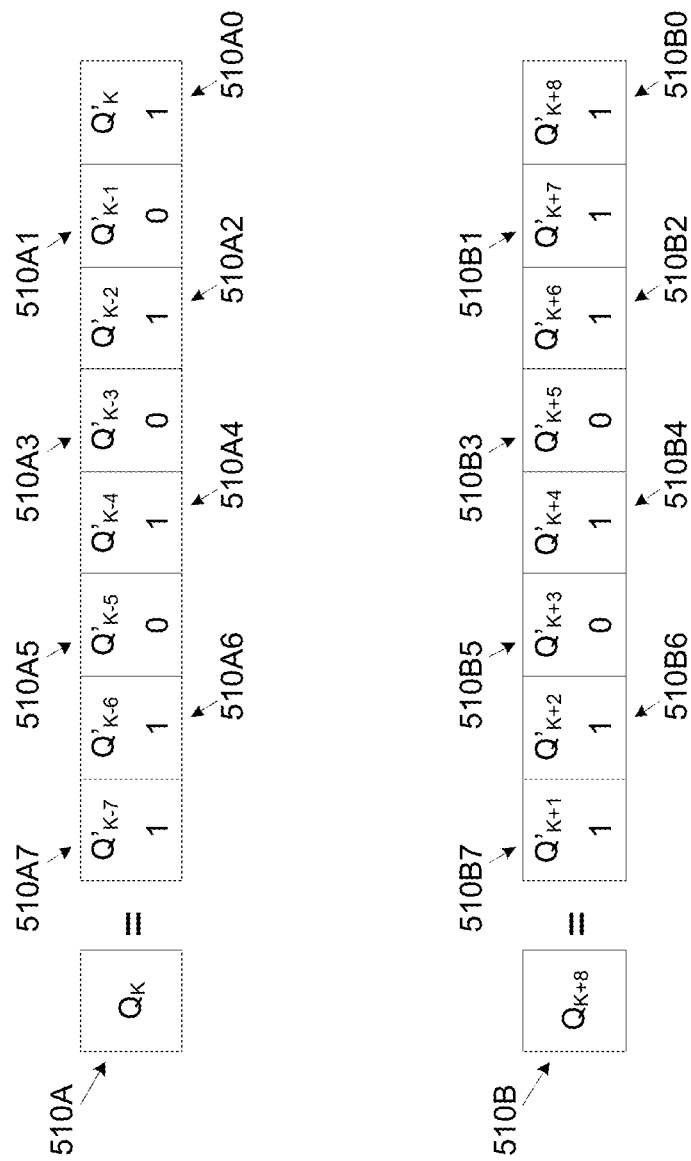
FIG. 5C is a schematic illustration of an exemplary process of qualifying partial rolling hash values with partial segmentation criteria, according to some embodiments of the present disclosure.
Figure 5D:
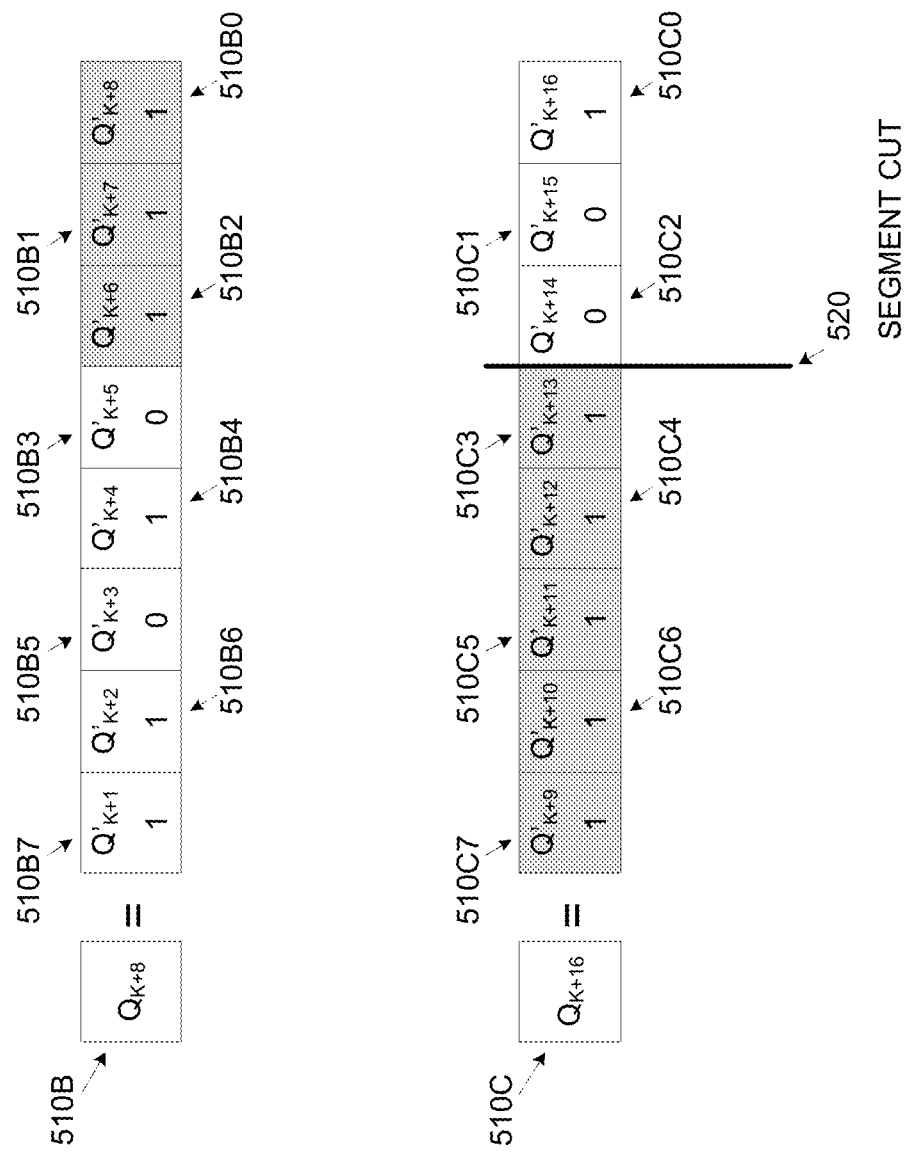
FIG. 5D is a schematic illustration of an exemplary process of qualifying partial rolling hash values with partial segmentation criteria, according to some embodiments of the present disclosure.

Reference is now made to FIGS. 5C and 5D, which are schematic illustrations of an exemplary process of qualifying partial rolling hash values with partial segmentation criteria, according to some embodiment of the present disclosure.

As shown in FIG. 5C, $Q_K$ 510A is a segmentation criteria which is a combination of a set of partial segmentation criteria $Q'_{K-7}$ 510A7-$Q'_K$ 510A0. Since the partial segmentation criteria $Q'_{K-5}$ 510A5, $Q'_{K-3}$ 510A3 and $Q'_{K-1}$ 510A1 do not comply with the respective partial segmentation criteria, the coordinator 110 may decide the entire segmentation criterion $Q_K$ 510A is not satisfied. The same applies to the segmentation criterion $Q_{K+8}$ 510B which is a combination of a set of partial segmentation criteria $Q'_{K+1}$ 510B7-$Q'_{K+8}$ 510B0 and is not met since not all the partial segmentation criteria $Q'_{K+1}$ 510B7-$Q'_{K+8}$ 510B0 comply with the respective partial segmentation criteria. Furthermore, there is no sequence of partial segmentation criteria in the two following segmentation criterion $Q_K$ 510A and $Q_{K+8}$ 510B which all comply with their respective partial segmentation criteria so the corresponding sequence may not be designated a segment boundary or "cut" point.

On the other hand, as shown in FIG. 5D the coordinator 110 may identify that a set of 8 consecutive partial segmentation criteria $Q'_{K+6}$ 510B2 through $Q'_{K+13}$ 510C3 all comply with their respective partial segmentation criteria and therefore the coordinator may insert "cut" 520 to designate the corresponding sequence as a segment, where the sequence includes the data items up to a rolling sequence 510C3 (included).

The coordinator 110 may then proceed to identify a following segment in a sequence of the input data stream 120 where the following sequence start where the previously detected segment ends.

Reference is made once again to FIG. 2. As shown at 212, which is a decision point, in case the coordinator 110 detects the end of the input data stream 120 is reached, the process 200 is branched to 214. In case the coordinator 110 detects that the input data stream 120 comprises additional data items, the coordinator 110 may branch to 204 to repeat the segmentation process for the following sequence of the input data stream 120. The coordinator 110 repeats steps 204 through 212 until reaching the end of the input data stream 120 to create the segmented data stream 130.

As shown at 214, once the segmentation process 200 for the input data stream 120 ends, the coordinator 110 may output the segmented data stream 130 using, for example, the I/O interface 102.

Following the segmentation, the coordinator 110 may output the segmented data stream to be used for one or more of a plurality of applications, for example, data deduplication.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

It is expected that during the life of a patent maturing from this application many relevant vector processing technologies such as SIMD will be developed and the scope of the term SIMD is intended to include all such new technologies a priori.

As used herein the term "about" refers to ±10%.

The terms "comprises", "comprising", "includes", "including", "having" and their conjugates mean "including but not limited to". This term encompasses the terms "consisting of" and "consisting essentially of".

The phrase "consisting essentially of" means that the composition or method may include additional ingredients and/or steps, but only if the additional ingredients and/or steps do not materially alter the basic and novel characteristics of the claimed composition or method.

As used herein, the singular form "a", "an" and "the" include plural references unless the context clearly dictates otherwise. For example, the term "a compound" or "at least one compound" may include a plurality of compounds, including mixtures thereof.

The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the disclosure may include a plurality of "optional" features unless such features conflict.

It is appreciated that certain features of the disclosure, which are, for clarity, described in the context of separate embodiments, may also be provided in combination in a single embodiment. Conversely, various features of the disclosure, which, for brevity, described in the context of a single embodiment, may also be provided separately or in any suitable sub combination or as suitable in any other described embodiment of the disclosure. Certain features described in the context of various embodiments are not to be considered essential features of those embodiments, unless the embodiment is inoperative without those elements.

The invention claimed is:

1. A system for block deduplication, comprising:
   a non-transitory memory comprising instructions;
   a vector processor in communication with the memory, wherein the vector processor is configured to execute the instructions to create, from an input data stream, a segmented data stream comprising a plurality of variable size segments, wherein defining a segment of the plurality of variable size segments comprises:
      applying a rolling sequence over a sequence of consecutive data items of the input data stream, the rolling sequence including a subset of consecutive data items of the sequence;
      calculating a plurality of partial hash values, wherein the plurality of partial hash values are calculated concurrently by a plurality of vector processing pipelines of the vector processor, wherein each partial hash value corresponds to a respective partial rolling sequence out of a plurality of partial rolling sequences, and wherein each partial rolling sequence is comprised of a plurality of evenly spaced data items of the subset;
      determining compliance of each of the plurality of partial hash values with at least one respective partial segmentation criterion; and
      designating a cut in the sequence which defines the segment of the sequence in response to at least one of the plurality of partial hash values complying with the at least one respective partial segmentation criterion; and
   a deduplication application configured to receive the segmented data stream and perform block deduplication on the segmented data stream;
   wherein the at least one respective partial segmentation criterion defines a data pattern; and
   wherein determining compliance of each of the plurality of partial hash values with at least one respective partial segmentation criterion comprises:
      checking whether a portion of each partial hash value equals a predefined value; or
      checking whether each partial hash value is larger than a predefined value.

2. The system according to claim 1, wherein the vector processor is a single-instruction-multiple data (SIMD) processor.

3. The system according to claim 1, wherein
   each of the plurality of partial hash values is calculated as a partial rolling hash value using a respective partial hash value of a respective previous partial rolling sequence, an omitted data item which is omitted from the respective partial rolling sequence, and an added data item which is added to the respective partial rolling sequence.

4. The system according to claim 1, wherein designating the cut in the sequence is further in response to a number of consecutive complying partial hash values calculated for successive subsets of the sequence which comply with the at least one respective partial segmentation criterion exceeding the number of the plurality of partial rolling sequences.

5. The system according to claim 1, wherein the sequence includes a pre-defined minimum number of the consecutive data items.

6. The system according to claim 1, wherein the vector processor is further configured to execute the instructions to facilitate:
   designating a cut in the sequence in response to a size of an uncut segment reaching a pre-defined maximum value.

7. A method for block deduplication, the method comprising:
   creating, from an input data stream, a segmented data stream comprising a plurality of variable size segments, wherein defining a segment of the plurality of variable size segments comprises:
      applying a rolling sequence over a sequence of consecutive data items of the input data stream, the rolling sequence includes a subset of consecutive data items of the sequence;
      calculating a plurality of partial hash values, wherein the plurality of partial hash values are calculated concurrently by a plurality of vector processing pipelines of the vector processor, wherein each partial hash value corresponds to a respective partial rolling sequence out of a plurality of partial rolling sequences, and wherein each partial rolling sequence is comprised of a plurality of evenly spaced data items of the subset;
      determining compliance of each of the plurality of partial hash values with at least one respective partial segmentation criterion; and
      designating a cut in the sequence which defines the segment of the sequence in response to at least one of the plurality of partial hash values complying with the at least one respective partial segmentation criterion; and
   performing block deduplication on the segmented data stream;
   wherein the at least one respective partial segmentation criterion defines a data pattern; and
   wherein determining compliance of each of the plurality of partial hash values with at least one respective partial segmentation criterion comprises:
      checking whether a portion of each partial hash value equals a predefined value; or
      checking whether each partial hash value is larger than a predefined value.

8. The method according to claim 7, wherein each of the plurality of partial hash values is calculated as a partial rolling hash value using a respective partial hash value of a respective previous partial rolling sequence, an omitted data item which is omitted from the respective partial rolling sequence, and an added data item which is added to the respective partial rolling sequence.

9. The method according to claim 7, wherein designating the cut in the sequence is further in response to a number of consecutive complying partial hash values calculated for successive subsets of the sequence which comply with the at least one respective partial segmentation criterion exceeding the number of the plurality of partial rolling sequences.

10. The method according to claim 7, wherein the sequence includes a pre-defined minimum number of the consecutive data items.

11. The method according to claim 7, wherein the method further comprises:

designating a cut in the sequence in response to a size of an uncut segment reaching a pre-defined maximum value.

12. A non-transitory computer-readable medium having instructions stored thereon, wherein the instructions, when executed, facilitate:

creating, from an input data stream, a segmented data stream comprising a plurality of variable size segments, wherein defining a segment of the plurality of variable size segments comprises:

applying a rolling sequence over a sequence of consecutive data items of the input data stream, the rolling sequence includes a subset of consecutive data items of the sequence;

calculating a plurality of partial hash values, wherein the plurality of partial hash values are calculated concurrently by a plurality of vector processing pipelines of the vector processor, wherein each partial hash value corresponds to a respective partial rolling sequence out of a plurality of partial rolling sequences, and wherein each partial rolling sequence is comprised of a plurality of evenly spaced data items of the subset;

determining compliance of each of the plurality of partial hash values with at least one respective partial segmentation criterion; and designating a cut in the sequence which defines the segment of the sequence in response to at least one of the plurality of partial hash values complying with the at least one respective partial segmentation criterion; and performing block deduplication on the segmented data stream;

wherein the at least one respective partial segmentation criterion defines a data pattern; and wherein determining compliance of each of the plurality of partial hash values with at least one respective partial segmentation criterion comprises:

checking whether a portion of each partial hash value equals a predefined value; or checking whether each partial hash value is larger than a predefined value.

\* \* \* \* \*